(12) United States Patent
Kim

(10) Patent No.: US 7,405,619 B2
(45) Date of Patent: Jul. 29, 2008

(54) AMPLIFICATION CIRCUIT IMPROVED WITH LINEARITY AND FREQUENCY CONVERTER USING THE SAME

(75) Inventor: Tae Wook Kim, Austin, TX (US)

(73) Assignee: Integrant Technologies Inc., Gyeonggi-do (KR)

( * ) Notice: Subject to any disclaimer, the term of this patent is extended or adjusted under 35 U.S.C. 154(b) by 102 days.

(21) Appl. No.: 11/467,308

(22) Filed: Aug. 25, 2006

(65) Prior Publication Data

US 2007/0057726 A1 Mar. 15, 2007

(30) Foreign Application Priority Data

Aug. 30, 2005 (KR) ........................ 10-2005-0080249

(51) Int. Cl.
*H03F 1/00* (2006.01)
(52) U.S. Cl. ....................................... 330/165; 330/296
(58) Field of Classification Search ................. 330/165, 330/310, 150, 98, 285, 296
See application file for complete search history.

(56) References Cited

U.S. PATENT DOCUMENTS

| 3,038,072 | A | * | 6/1962 | Proudfit | 455/252.1 |
| 3,886,458 | A | * | 5/1975 | Matsumoto et al. | 455/320 |
| 3,946,280 | A | * | 3/1976 | Quist | 361/88 |
| 3,949,306 | A | * | 4/1976 | Watanabe et al. | 455/333 |

* cited by examiner

*Primary Examiner*—Henry K Choe
(74) *Attorney, Agent, or Firm*—Foley & Lardner

(57) ABSTRACT

Provided is a frequency converter using an amplification circuit that is improved with linearity by coupling a main transistor and an auxiliary transistor in parallel. An amplification circuit that is improved with linearity comprises an input block amplifying an input signal, an induction block inducing a current proportionate to an output signal of the input block and an amplification block comprising. The amplification block comprises a main transistor amplifying the output signal of the induction block, wherein the main transistor is biased to operate at a saturation region and an auxiliary transistor amplifying the output signal of the induction block, wherein the auxiliary transistor is biased to operate at a sub-threshold region and coupled to the main transistor in parallel.

5 Claims, 3 Drawing Sheets

Prior Art

AMPLIFICATION CIRCUIT IMPROVED WITH LINEARITY AND FREQUENCY CONVERTER USING THE SAME

This Nonprovisional application claims priority under 35 U.S.C. § 119(a) on Patent Application No. 10-2005-0080249 filed in Korea on Aug. 30, 2005, the entire contents of which are hereby incorporated by reference.

BACKGROUND OF THE INVENTION

1. Field of the Invention

The present invention relates to a frequency converter, and more particularly, to a frequency converter using a high-linearity amplifier.

2. Description of the Background Art

FIG. 1 illustrates a simplified block diagram of a conventional frequency converter.

The conventional frequency converter includes a local oscillator 101, a mixer 102 and an amplifier 103.

The local oscillator 101 articulately adjusts a voltage level of a voltage control oscillator and locks an output frequency to an intended frequency to oscillate a frequency for converting an intermediate frequency (IF) band into a radio frequency (RF) band.

The mixer 102 receives the oscillated frequency and the IF and, converts the oscillated frequency and the IF into a frequency at the RF band.

The amplifier 103 amplifies an output signal of the mixer 102.

The linearity of the mixer 102 is important to determine the linearity of the frequency converter. However, the linearity of the amplifier 103 is more important than that of the mixer 102 to determine the linearity of the frequency converter.

Hence, improving the linearity of the amplifier 103 is necessary to obtain high linearity of the frequency converter.

SUMMARY OF THE INVENTION

Accordingly, the present invention is directed to provide a frequency converter improved with linearity by using a high-linearity amplifier.

According to an embodiment of the present invention, an amplification circuit improved with linearity comprises an input block amplifying an input signal; an induction block inducing a current proportionate to an output signal of the input block; and an amplification block comprising: a main transistor amplifying the output signal of the induction block, wherein the main transistor is biased to operate at a saturation region; and an auxiliary transistor amplifying the output signal of the induction block, wherein the auxiliary transistor is biased to operate at a subthreshold region and coupled to the main transistor in parallel.

In one embodiment of the present invention, the input block comprises a resistor and an amplification transistor, wherein the amplification transistor is configured to a common source circuit and the resistor is electrically connected to the output terminal of the amplification transistor.

In one embodiment of the present invention, the main transistor and the auxiliary transistor are configured to a common gate circuit and amplification block further comprising: a current source electrically connected to the induction block; and a second resistor connected to the output terminal of the main transistor and the auxiliary transistor In one embodiment of the present invention, the induction block may comprise a transformer.

In one embodiment of the present invention, the transformer may be a chip transformer to output current.

According to another embodiment of the present invention, a frequency converter comprises an input block comprising a differential pair of first and second transistors and amplifying a differential input signal; a transfer block transferring an output signal of the input block; a mixing block comprising: a differential pair of third and fourth transistors; and a differential pair of fifth and sixth transistors, wherein each of the differential pair receives an output signal of the transfer block and a differential carrier wave signal and generates a differential mixing signal proportionate to the addition of the output signal of the transfer block and the differential carrier wave signal; an induction block inducing an output current signal by the differential mixing signal; and an amplification block comprising: a main transistor amplifying the output signal of the induction block, wherein the main transistor is biased to operate at a saturation region; and an auxiliary transistor amplifying the output signal of the induction block, wherein the auxiliary transistor is biased to operate at a subthreshold region and coupled to the main transistor in parallel.

In the other embodiment of the present invention, the main transistor and the auxiliary transistor are configured to a common gate circuit and the amplification block further comprising: an inductor electrically connected an output terminal of the main transistor and the auxiliary transistor; and a capacitor electrically connected an output terminal of the main transistor and the auxiliary transistor.

In the other embodiment of the present invention, the input block may further comprise a current source supplying a current commonly to the first and second transistors.

In the other embodiment of the present invention, the transfer block may be configured with a current mirror.

In the other embodiment of the present invention, the induction block may comprise a transformer.

In the other embodiment of the present invention, the transformer may be a chip transformer to output current.

In the other embodiment of the present invention, the auxiliary transistor of the amplification block may be coupled with more than one transistor in parallel.

Detailed description of various embodiments of the present invention will be provided herein below with reference to the accompanying drawings.

Various features and advantages of the present invention will now be described more fully with reference to the accompanying drawings, in which exemplary embodiments of the invention on an amplification circuit improved with linearity and a frequency converter using the same are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Also, the invention is defined within the scope of the appended claims. Like reference numerals denote like elements even in different drawings.

BRIEF DESCRIPTION OF THE DRAWINGS

The invention will be described in detail with reference to the following drawings in which like numerals refer to like elements.

DETAILED DESCRIPTION OF EMBODIMENTS

Exemplary embodiments of the present invention will be described in a more detailed manner with reference to the drawings.

Figure 1:
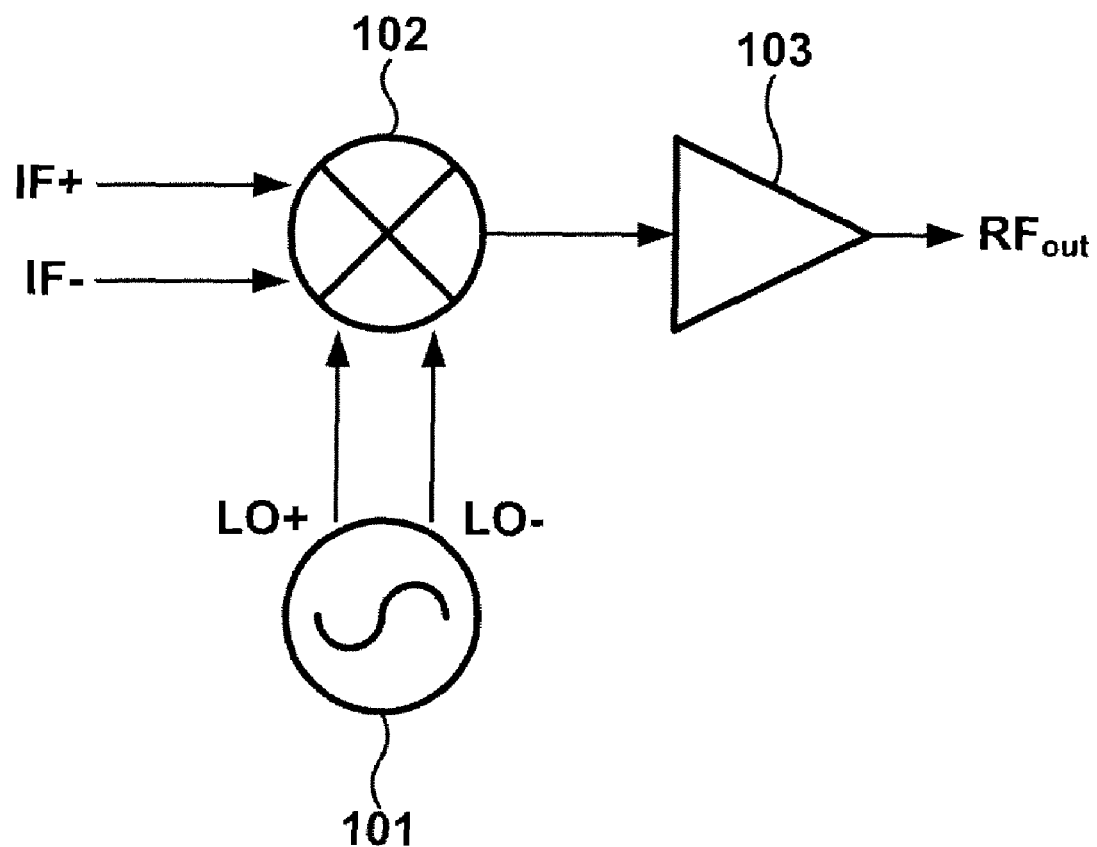
FIG. 1 illustrates a simplified block diagram of a conventional frequency converter.
Figure 2:
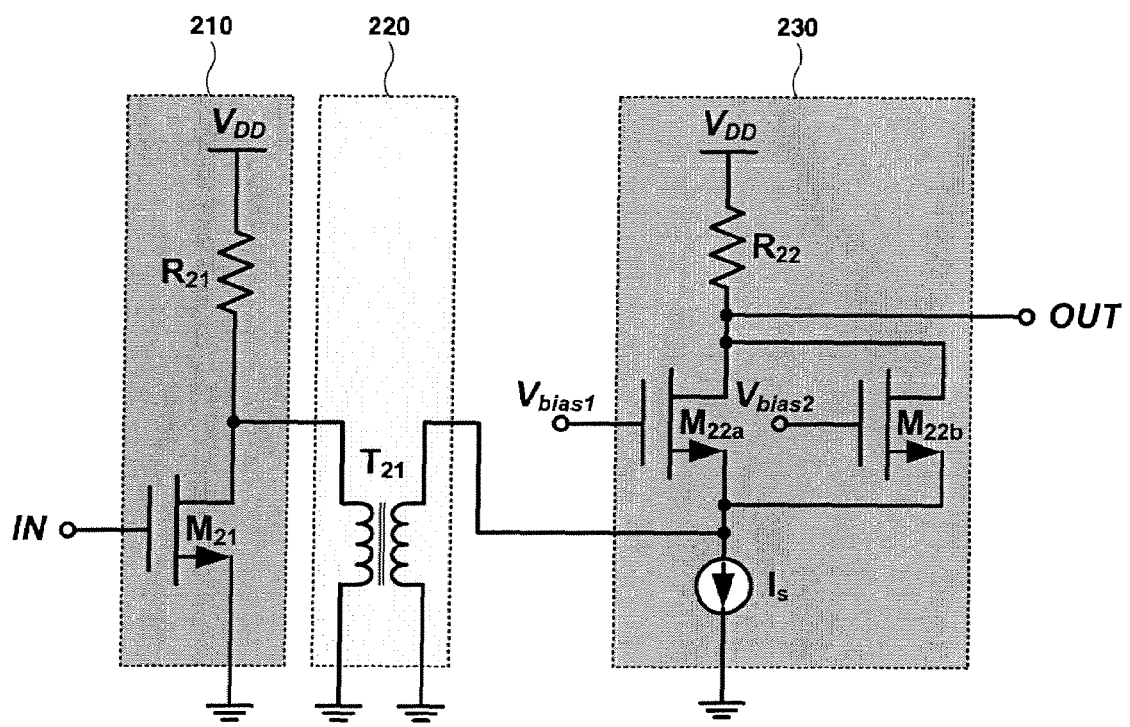
FIG. 2 illustrates a simplified block diagram of a linearity-improved amplification circuit that executes an amplification operation by a low current signal according to an embodiment of the present invention.

FIG. 2 illustrates a simplified block diagram of a linearity-improved amplification circuit that executes an amplification operation by a low current signal according to an embodiment of the present invention.

The amplification circuit comprises an input block 210, an induction block 220 and an amplification block 230.

The input block 210 comprises an input resistor $R_{21}$ and an amplification transistor $M_{21}$. The induction block 220 comprises a transformer T21. The amplification block 230 comprises a current source $I_s$, a main transistor $M_{22a}$, an auxiliary transistor $M_{22b}$, and an output resistor $R_{22}$.

A gate terminal of the amplification transistor $M_{21}$ is coupled to an input terminal IN.

The amplification transistor $M_{21}$ comprises a drain terminal commonly coupled to the input resistor $R_{21}$ and an primary coil of the transformer $T_{21}$.

A secondary coil of the transformer $T_{21}$ is commonly coupled to one terminal of the current source $I_s$, a source terminal of the main transistor $M_{22a}$ and a source terminal of the auxiliary transistor $M_{22b}$.

A drain terminal of the main transistor $M_{22a}$ is coupled commonly to a drain terminal of the auxiliary transistor $M_{22b}$ and the output resistor $R_{22}$.

When an input signal is supplied to the input terminal IN, voltage levels between the source and drain terminals of the amplification transistor $M_{21}$ vary in proportional to the magnitude of the input signal supplied to the gate terminal of the amplification transistor $M_{21}$.

More specifically, the voltage levels drop down as much as a voltage level multiplied with an amount of current flowing from a drain voltage VDD to the input resistor $R_{21}$.

The voltage level of the drain terminal of the amplification transistor $M_{21}$ is supplied to the primary coil of the transformer $T_{21}$.

Due to the voltage supplied to the primary coil of the transformer $T_{21}$, current is induced at the secondary coil of the transformer $T_{21}$.

Particularly, the transformer $T_{21}$ is a current output chip transformer having a winding ratio of the primary and the secondary coil is N:1, where N is a positive number. It means, for example, when a voltage V1 and a current I1 are supplied to the primary coil, a voltage of the secondary coil is induced to drop down by a value of about 1/N*V1, while an amount of current is induced to increase by about N*I1. Thus, the primary coil of the transformer exhibits high impedance, high voltage and low current characteristics, while the secondary coil of the transformer exhibits low impedance, low voltage and high current characteristics.

On the basis of these characteristics, a narrow-band transformer allows the device operation with the low voltage and impedance but without decreasing a voltage gain.

The secondary coil of the transformer $T_{21}$ is coupled commonly to the current source $I_s$ and the source terminals of the main transistor $M_{22a}$ and the auxiliary transistor $M_{22b}$.

The main transistor $M_{22a}$ and the auxiliary transistor $M_{22b}$ are coupled together in parallel.

The main transistor $M_{22a}$ is supplied with a first bias voltage $V_{bias1}$ to operate at a saturation region, while the auxiliary transistor $M_{22b}$ is supplied with a second bias voltage $V_{bias2}$ to operate at a subthreshold region.

Eventually, configuring the main transistor $M_{22a}$ and the auxiliary transistor $M_{22b}$ to operate respectively at the saturation region and the subthreshold region allows the main transistor $M_{22a}$ to have the improved linearity. More specifically, the addition of second derivative values (gm") of the transconductance for a source-drain voltage of the main transistor $M_{22a}$ and the auxiliary transistor $M_{22b}$ is set as the second bias voltage $V_{bias2}$ that makes an integrated value of the addition at the operation region of the entire circuit minimum. As a result, the non-linearity of the main transistor $M_{22a}$ can be reduced.

A signal change takes place at the output terminal OUT according to a change in a low current signal which is generated from the secondary coil supplied to the main transistor M22a and the auxiliary transistor $M_{22b}$.

This signal change enhances the linearity of the amplification due to the improvement on the linearity of the main transistor $M_{22a}$ and the auxiliary transistor $M_{22b}$.

Also, the auxiliary transistor M22b may be coupled with one or more than one transistor to improve the linearity.

As described above, instead of using a high voltage signal applied to the input terminal IN, the high voltage signal is transformed into a low current signal at the transformer $T_{21}$. As a result, the linearity of the output signal can be improved using the linearity improved amplification circuit.

Figure 3:
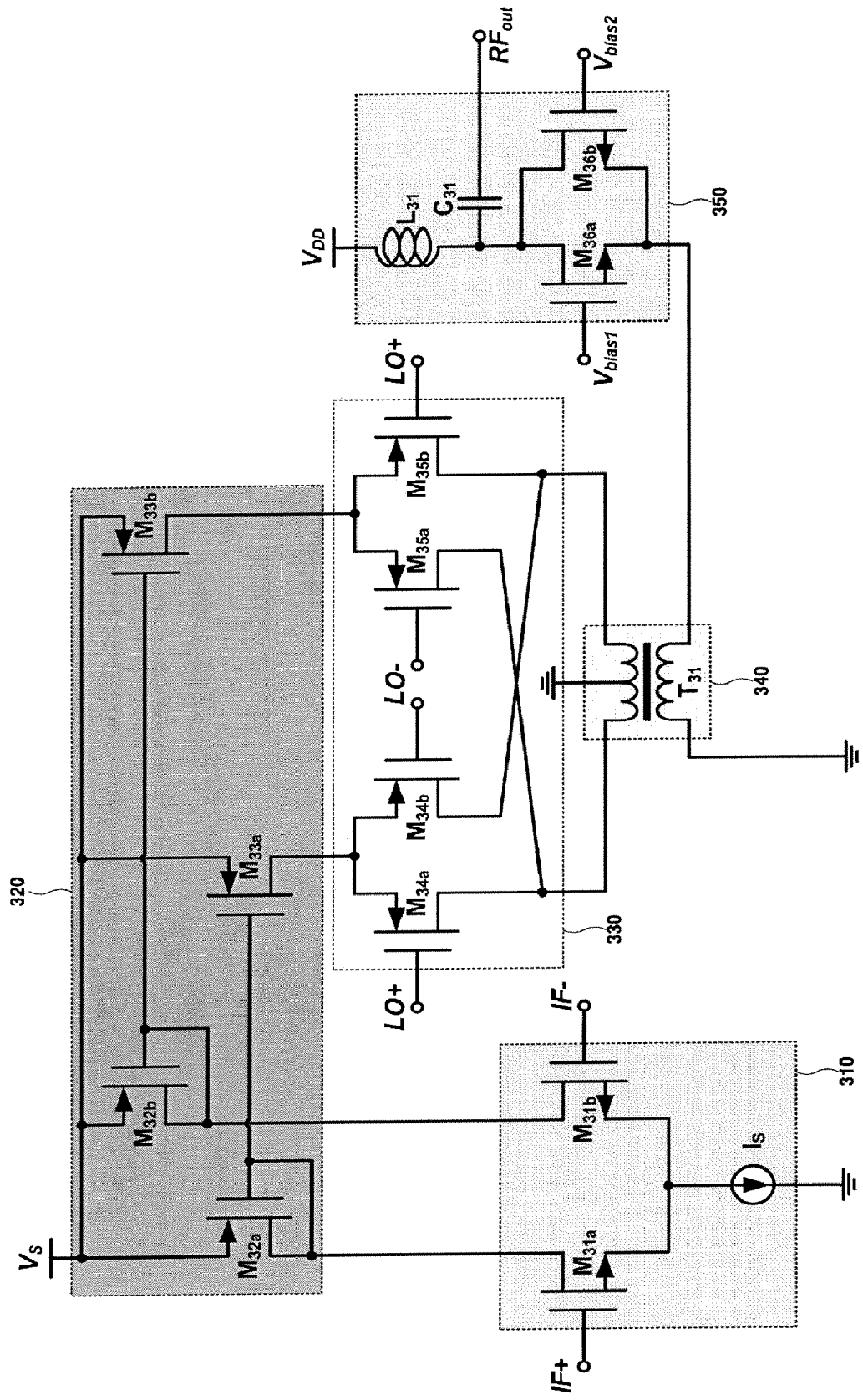
FIG. 3 illustrates a simplified block diagram of a frequency converter using a linearity-improved amplification circuit according to another embodiment of the present invention.

FIG. 3 illustrates a simplified block diagram of a frequency converter using a linearity-improved amplification circuit according to another embodiment of the present invention.

The frequency converter comprises an input block 310, a transfer block 320, a mixing block 330, an induction block 340, and an amplification block 350.

The input block 310 comprises a first transistor $M_{31a}$, a second transistor $M_{31b}$, current source $I_s$.

The transfer block 320 comprises a third transistor $M_{32a}$, a fourth transistor $M_{32b}$, a fifth transistor $M_{33a}$, and a sixth transistor $M_{33b}$.

The mixing block 330 comprises a seventh transistor $M_{34a}$, an eighth transistor $M_{34b}$, a ninth transistor $M_{35a}$, and a tenth transistor $M_{35b}$.

The induction block 340 comprises a transformer $T_{31}$.

The amplification block 350 comprises a main transistor $M_{36a}$, an auxiliary transistor $M_{36b}$, an inductor $L_{31}$, and a capacitor $C_{31}$.

One terminal of the current source $I_s$ is coupled to source terminals of the first and second transistors $M_{31a}$ and $M_{31b}$.

A drain terminal of the first transistor $M_{31a}$ is coupled commonly to a drain terminal and a gate terminal of the third transistor $M_{32a}$.

A drain terminal of the second transistor $M_{31b}$ is coupled commonly to a drain terminal and a gate terminal of the fourth transistor $M_{32b}$.

The gate terminal of the third transistor $M_{32a}$ is coupled to a gate terminal of the fifth transistor $M_{33a}$.

The gate terminal of the fourth transistor $M_{32b}$ is coupled to a gate terminal of the sixth transistor $M_{33b}$.

A drain terminal of the fifth transistor $M_{33a}$ is coupled commonly to a source terminal of the seventh transistor $M_{34a}$ and a source terminal of the eighth transistor $M_{34b}$.

A drain terminal of the sixth transistor $M_{33b}$ is coupled commonly to a source terminal of the ninth transistor $M_{35a}$ and a source terminal of the tenth transistor $M_{35b}$.

A drain terminal of the seventh transistor $M_{34a}$ is coupled commonly to a drain terminal of the ninth transistor $M_{35a}$ and one side of a primary coil of the transformer $T_{31}$.

A drain terminal of the eighth transistor $M_{34b}$ is coupled commonly to a drain terminal of the tenth transistor $M_{35b}$ and the other side of the primary coil of the transformer $T_{31}$.

A one side of the secondary of the transformer $T_{31}$ is coupled to a source terminal of the main transistor $M_{36a}$ and a source terminal of the auxiliary transistor $M_{36b}$.

A drain terminal of the main transistor $M_{36a}$ is coupled to a drain terminal of the auxiliary transistor $M_{36b}$, one terminal of the inductor $L_{31}$ and one terminal of the capacitor $C_{31}$.

The other terminal of the capacitor $C_{31}$ is coupled to an output terminal RFout.

First and second IFs IF+ and IF− are supplied respectively to the gate terminals of the first and second transistors $M_{31a}$ and $M_{31b}$ of the input block 310. The first and second IFs IF+ and IF− have a differential input electric potential.

The gate terminals of the third and fourth transistors $M_{32a}$ and $M_{32b}$ of the transfer block 320 have a differential transfer electric potential changing in proportional to a change in the differential input electric potential of the first and second IFs IF+ and IF−.

The transfer block 320 is configured with a current mirror.

The drains of the fifth and sixth transistors $M_{33a}$ and $M_{33b}$ have a differential output electric potential changing in proportional to the change in the differential transfer electric potential.

The gates of the seventh and tenth transistors $M_{34a}$ and $M_{35b}$ are supplied with a first carrier wave L0+, while the gates of the eighth and ninth transistors $M_{34b}$ and $M_{35a}$ are supplied with a second carrier wave L0−. The first and second carrier waves have a differential carrier wave electric potential.

The mixing block 330 outputs differential mixing electric potentials, each proportional to the addition of the differential input electric potential of the first and second IFs IF+ and IF− and the differential carrier wave electric potential of the first and second L0+ and L0−.

The differential mixing electric potentials of the mixing block 330 are supplied differentially to one side and the other side of the primary coil of the transformer $T_{31}$ of the induction block 340.

The transformer T31 is a chip transformer to output current.

An output current induces to the secondary coil of the transformer $T_{31}$ of the induction block 340 and is supplied to the amplification block 350.

The output current is supplied to the source terminals of the main and auxiliary transistors $M_{36a}$ and $M_{36b}$ of the amplification block 350.

Particularly, the first bias voltage $V_{bias1}$ is supplied to the gate terminal of the main transistor $M_{36a}$ to make the main transistor $M_{36a}$ operate at the saturation region. On the other hand, the second bias voltage $V_{bias2}$ is supplied to the gate terminal of the auxiliary transistor $M_{36b}$ to make the auxiliary transistor $M_{36b}$ operate at the subthreshold region.

The linearity of the auxiliary transistor $M_{36b}$ can be improved by coupling the auxiliary transistor $M_{36b}$ with more than one transistor.

A voltage of the output terminal RFout changes in proportional to a change in the output current.

The improvement on the linearity of the amplification block 350 is already described in FIG. 2, detailed description thereof will be omitted since the scope and spirit of the linearity improvement is substantially the same as the one described in FIG. 2.

On the basis of the above-described configuration, wherein a high linearity amplifier is used as the amplifier of the frequency converter, the frequency converter can have the improved linearity.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

What is claimed is:

1. An amplification circuit improved with linearity, comprising:
    an input block amplifying an input signal;
    an induction block inducing a current proportionate to an output signal of the input block; and
    an amplification block comprising;
        a main transistor amplifying the output signal of the induction block, wherein the main transistor is biased to operate at a saturation region; and
        an auxiliary transistor amplifying the output signal of the induction block, wherein the auxiliary transistor is biased to operate at a subthreshold region and coupled to the main transistor in parallel.

2. The amplification circuit of claim 1, wherein the input block comprises a resistor and an amplification transistor, wherein the amplification transistor is configured to a common source circuit and the resistor is electrically connected to the output terminal of the amplification transistor.

3. The amplification circuit of claim 1, wherein the main transistor and the auxiliary transistor are configured to a common gate circuit and amplification block further comprising:
    a current source electrically connected to the induction block; and
    a second resistor connected to the output terminal of the main transistor and the auxiliary transistor.

4. The amplification circuit of claim 1, wherein the induction block comprises a transformer.

5. The amplification circuit of claim 4, wherein the transformer is a chip transformer to output current.

* * * * *